(12) United States Patent
Kuznetsov et al.

(10) Patent No.: US 11,444,609 B2
(45) Date of Patent: Sep. 13, 2022

(54) MOBILE HYBRID ELECTRIC POWER SYSTEM

(71) Applicant: Raytheon Company, Waltham, MA (US)

(72) Inventors: Stephen B. Kuznetsov, Marlborough, MA (US); Eric J. Stich, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 296 days.

(21) Appl. No.: 15/929,473

(22) Filed: May 4, 2020

(65) Prior Publication Data
US 2021/0344331 A1    Nov. 4, 2021

(51) Int. Cl.
| H03K 3/45 | (2006.01) |
| H02J 3/32 | (2006.01) |
| H02J 15/00 | (2006.01) |
| H02K 17/30 | (2006.01) |
| H02K 17/42 | (2006.01) |

(52) U.S. Cl.
CPC .............. *H03K 3/45* (2013.01); *H02J 3/32* (2013.01); *H02J 15/00* (2013.01); *H02K 17/30* (2013.01); *H02K 17/42* (2013.01)

(58) Field of Classification Search
CPC ... H03K 3/45; H02J 3/32; H02J 15/00; H02K 17/30; H02K 17/42
USPC ........................................................ 310/144
See application file for complete search history.

(56) References Cited

U.S. PATENT DOCUMENTS

| 9,373,963 | B2 | 6/2016 | Kuznetsov | |
| 9,531,289 | B2 | 12/2016 | Kuznetsov | |
| 9,667,232 | B2 | 5/2017 | Kuznetsov | |
| 9,837,996 | B2 | 12/2017 | Kuznetsov | |
| 10,008,857 | B2 * | 6/2018 | Kolhatkar | ................. H02J 9/08 |
| 10,298,212 | B2 | 5/2019 | Kuznetsov | |
| 2016/0336928 | A1 | 11/2016 | Kuznetsov | |
| 2017/0264101 | A1 | 9/2017 | Kolhatkar et al. | |

FOREIGN PATENT DOCUMENTS

CN              110138163 A      8/2019

OTHER PUBLICATIONS

International Search Report and Written Opinion of the International Searching Authority dated Jul. 7, 2021 in connection with International Patent Application No. PCT/US2021/026694, 10 pages.

* cited by examiner

*Primary Examiner* — Hal Kaplan

(57) ABSTRACT

A system includes a prime mover configured to rotate a shaft. The system also includes a wound rotor induction generator (WRIG). The WRIG includes a rotor coupled to the shaft of the prime mover and configured to rotate when the shaft rotates, where the rotor includes a rotor winding. The WRIG also includes a stator winding electrically connected to a utility source and a load. When the stator winding receives first power from the utility source, the WRIG is configured to transform at least one of a voltage and a frequency of the first power before outputting at least a portion of the first power to the load. When the stator winding does not receive the first power from the utility source, the WRIG is configured to generate second power due to kinetic energy of the rotor and output at least a portion of the second power to the load.

23 Claims, 9 Drawing Sheets

DELTA STATOR S2
48 SLOTS, 8 POLE

MOBILE HYBRID ELECTRIC POWER SYSTEM

TECHNICAL FIELD

This disclosure is generally directed to power systems. More specifically, this disclosure is directed to a mobile hybrid electric power system.

BACKGROUND

Existing portable power generator sets ("gensets"), such as for radar and launcher applications, typically require the ability to connect in parallel to a utility grid, with the ability to switch the load's power source between the genset and grid. However, a utility grid typically operates at a different frequency and different voltage level than is required by the load. As a result, large and heavy power transformers are often used to achieve grid matching. For these applications, the size and weight of the required transformers are prohibitive to mobility. In addition, energy storage is required to maintain power to the loads during the genset to grid, or grid to genset switch transition periods, which may be minutes in duration.

SUMMARY

This disclosure relates to a mobile hybrid electric power system.

In a first embodiment, a system includes a prime mover configured to rotate a shaft. The system also includes a wound rotor induction generator (WRIG). The WRIG includes a rotor coupled to the shaft of the prime mover and configured to rotate when the shaft rotates, where the rotor includes a polyphase rotor winding. The WRIG also includes a polyphase stator winding electrically connected to a utility source and a load. When the stator winding receives first power from the utility source, the WRIG is configured to transform at least one of a voltage and a frequency of the first power before outputting at least a portion of the first power to the load. When the stator winding does not receive the first power from the utility source, the WRIG is configured to generate second power due to kinetic energy of the rotor, and output at least a portion of the second power to the load. The system also includes an energy storage bank, which receives and stores a second portion of the first or second powers, for use to power the load during transitions between the first and second power sources In a second embodiment, a system includes a prime mover configured to rotate a shaft. The system also includes a WRIG. The WRIG includes a rotor coupled to the shaft of the prime mover and configured to rotate when the shaft rotates, where the rotor includes a polyphase rotor winding. The WRIG also includes a first polyphase stator winding electrically connected to a utility source and a load. The WRIG further includes a second stator winding electrically connected to an energy storage bank. When the first stator winding receives first power from the utility source, the WRIG is configured to transform at least one of a voltage and a frequency of the first power before outputting at least a portion of the first power to the load. When the first stator winding does not receive an adequate amount of the first power from the utility source, the WRIG is configured to generate second power due to kinetic energy of the rotor and output at least a portion of the second power to the load. This second power may be combined with a contribution of power from the utility source if the two sources are of the same frequency.

In a third embodiment, a device includes a rotor configured to be coupled to a shaft of a prime mover and rotated when the shaft rotates, where the rotor includes a polyphase rotor winding. The device also includes at least one stator winding configured to be electrically connected to a utility source and a load. When the at least one stator winding receives first power from the utility source, the device is configured to transform at least one of a voltage and a frequency of the first power before outputting at least a portion of the first power to the load. When the at least one stator winding does not receive the first power from the utility source, which may be deficient in voltage magnitude, deficient in power rating, or have a loss of one of more phases in a polyphase system, the device is configured to generate second power due to kinetic energy of the rotor and output at least a portion of the second power to the load.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, existing portable power generator sets ("gensets"), such as for radar and launcher applications, typically require the ability to connect onto a utility grid. However, a utility grid may operate at a different frequency and different voltage level than is required by the load. As a result, large and heavy power transformers are often used to solve the grid matching problem. For these applications, the size and weight of the required transformers are prohibitive to mobility. In addition, energy storage is required to maintain power to the loads during the genset to grid, or grid to genset switch transitions.

To address these or other issues, this disclosure provides various mobile hybrid electric power systems that allow efficient and compact frequency and voltage transformation with inputs from either a utility source or a local prime mover generator (such as a diesel engine). Circuitry forming part of each power system obviates the need for traditional power transformers, resulting in high overall power density and greater mobility. The disclosed power systems can also transition from a utility source to a local prime mover in a manner that is transparent to one or more loads, and in so doing can accomplish a transition from one power source to a second source within one electrical cycle. In addition, the disclosed power systems facilitate variable frequency output, which accommodates the needs of different types of loads.

Figure 1:
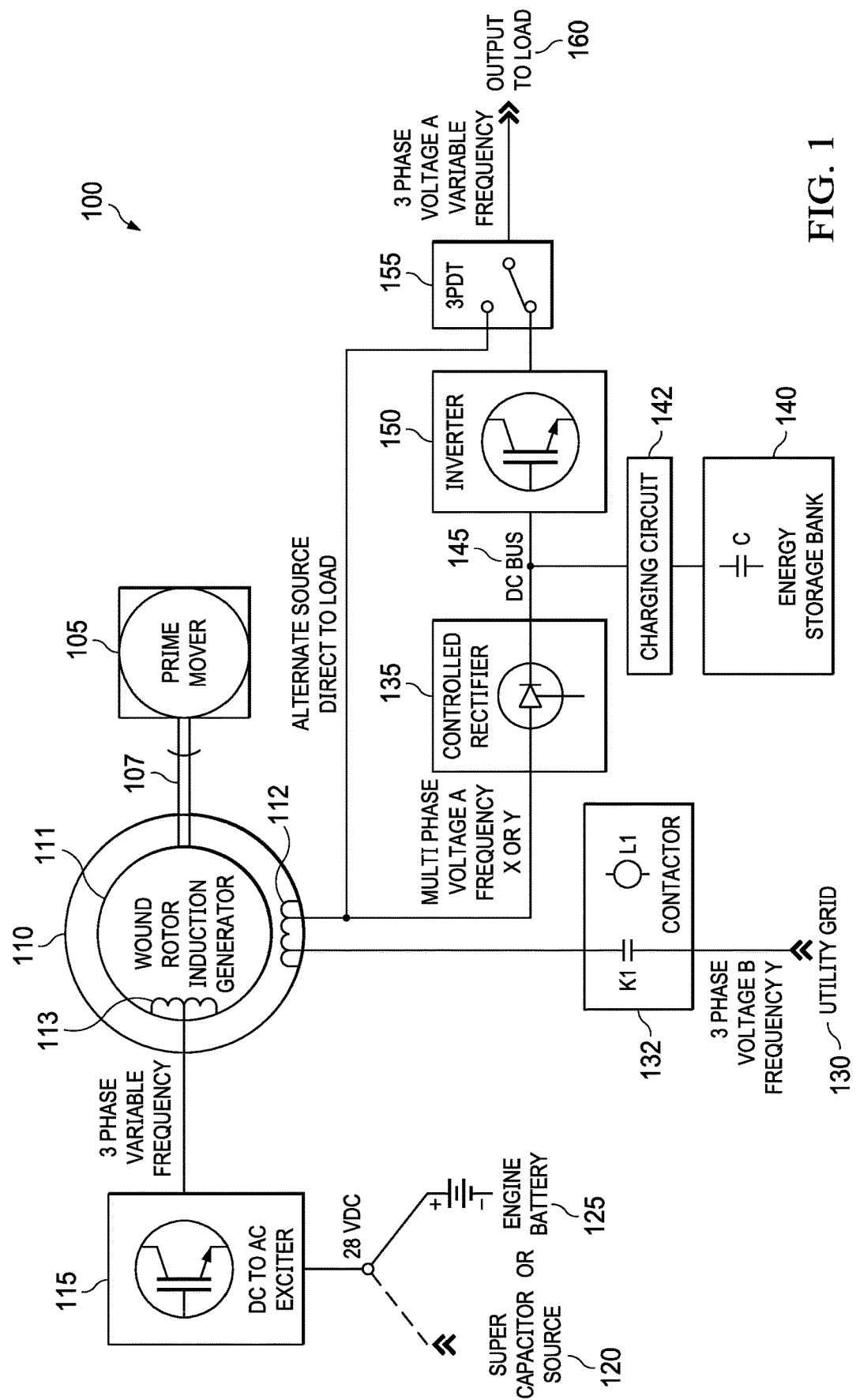
FIG. 1 illustrates an example mobile hybrid electric power system according to this disclosure.

FIG. 1 illustrates an example mobile hybrid electric power system 100 according to this disclosure. As described below, the system 100 enables significant energy storage and provides a seamless transfer between portable power and utility power without the need for large power transformers to transform voltage levels. The system 100 is compact and lightweight and allows output frequency conversion to suit an associated load with single stage conversion.

As shown in FIG. 1, the system 100 includes a prime mover 105. The prime mover 105 is configured to generate rotational power that is used to drive rotational kinetic energy in a wound rotor induction generator (WRIG) 110, which is connected to the prime mover 105 by a shaft 107. The stator of the WRIG 110 is normally a polyphase stator, but in special circumstances the stator can be a single-phase stator to accommodate single phase utility feeds. In some embodiments, the prime mover 105 operates to rotate the shaft 107 at a speed of approximately 2,000 to approximately 5,000 rotations per minute (RPMs), although other rotational speeds are possible and within the scope of this disclosure. The prime mover 105 includes any suitable structure that can generate rotational power, such as a motor with or without a gear mechanism on the output shaft. In some embodiments, the prime mover 105 represents or includes a diesel engine.

The WRIG 110 is configured to operate and output power in either of two modes: "utility mode" or "island mode." "Utility mode" refers to a mode in which the WRIG 110 receives power from a utility source 130 (such as a utility grid source) or another external power source and provides power to at least one load 160. "Island mode" refers to a mode in which the WRIG 110 operates off the prime mover 105 instead of the utility source 130 and thereby generates power that is provided to the load(s) 160. The WRIG 110 is configured to quickly and seamlessly transfer between utility mode and island mode as described in greater detail below.

In this example, the WRIG 110 includes a rotor 111 coupled to the shaft 107 of the prime mover 105, a stator winding 112, and a rotor winding 113. The WRIG 110 is configured to generate alternating current (AC) power when the rotor 111 is rotated by the shaft 107. In island mode, through the connection to the prime mover 105, the WRIG 110 can operate as a generator for portable power generation. An advantage of the WRIG 110 is that rotor excitation can be commanded to be a variable frequency to provide for constant output frequency when the rotor speed deviates from normal synchronous speed. In utility mode, the system 100 is powered by the utility source 130, through a switch 132 which is connected to the WRIG stator windings, yet the WRIG 110 does not operate as a generator. In utility mode, when the shaft 107 is not turning and the rotor 111 is stationary, the WRIG 110 operates as a voltage transformer through the voltage taps on the stator winding 112.

In utility mode, the WRIG 110 allows input-to-output voltage transformation within machine windings, thereby negating the need for transformers or phase shifters. For example, the stator winding 112 of the WRIG 110 may be tapped to transform the input line voltage received from the utility source 130 to a different output voltage level consistent with the voltage level of the load(s) 160. In some embodiments, the stator winding 112 may be tapped at one of 25%, 33%, 50%, or 75%. In general, the WRIG 110 can include one or multiple taps at one or multiple voltage levels. In some embodiments, the WRIG 110 can be wound for multiple voltage outputs. When combined with a controlled rectifier 135 and a DC-to-AC inverter 150, the different voltage outputs of the WRIG 110 enable the system 100 to generate power at different voltages and different frequencies.

The AC output power of the WRIG 110 can be converted through the rectifier 135 to direct current (DC) power, which feeds both an energy storage bank 140 and a DC input to the inverter 150. The inverter 150 operates as the main frequency converter before power is sent to the load(s) 160. The net result here is seamless and rapid power source transfer from the portable power of the prime mover 105 to the utility source 130 and vice versa. The output power of the WRIG 110 feeds the rectifier 135, the energy storage bank 140 on a DC bus 145, and the inverter 150. The output of the WRIG 110 may have a number of phases greater than the utility source. For example, the WRIG 110 may have 6-phase output whereas the utility may be a 3-phase source. This arrangement yields a lower harmonic content for the DC output of the rectifier and minimizes the amount of filtering required in the DC bus 145.

Use of the WRIG 110 (instead of a conventional DC field synchronous generator) allows use of newer, variable-speed, high-efficiency versions of the prime mover 105. For example, in some embodiments, the WRIG 110 can be configured to operate with a high-speed prime mover 105 exceeding 5,000 RPMs, which enables lightweight, efficient power generation. For example at a 6000 RPM shaft speed representative of a compact prime mover and with a 2 pole WRIG, if the rotor frequency is controlled to be 40 Hz, the stator output can be maintained at 60 Hz, which is of interest to many applications. In island mode, the WRIG 110 can maintain constant, high-frequency output power, even with wide speed variations in the shaft 107 connecting the WRIG 110 to the prime mover 105. By having variable frequency excitation to the rotor circuit of the WRIG 110, the prime mover 105 can operate over a wide range of operating speeds and not be bound by fixed speed operation as in conventional systems. Thus, even without a standard solid-state frequency converter, the WRIG 110 can output full power to the load(s) 160 at one or more specified frequencies, such as 60 Hz or 400 Hz, with no change in circuitry. The system 100 is also "transformer-less" (meaning it lacks transformers), which greatly enhances power density.

The output frequency of the WRIG 110 represents a summation of the synchronous shaft field frequency and the injected rotor frequency. For example, if the speed of the shaft 107 is 1,500 RPMs on a 24-pole machine (which yields 300 Hz for a synchronous machine) and the injected rotor frequency is 100 Hz, the output frequency at the stator winding 112 would equal 400 Hz (300 Hz+100 Hz). The voltage transformation ratio in the WRIG 110 may be step-up or step-down due to the specific design of the stator winding 112. In some embodiments, the WRIG 110 provides a 50% voltage step-down (such as 416V to 208V), which is advantageous in some applications. Of course, this is merely one example, and other voltage transformation ratios are possible and within the scope of this disclosure.

The WRIG 110 can be configured in different ways depending on the application. For example, in some embodiments, the WRIG 110 can be configured as a three-phase, six-phase, or twelve-phase transformer. Other configurations are possible, as well. Also, in some embodiments, the stator winding 112 of the WRIG 110 includes a six-phase stator winding with wye and delta output windings at a 30° phase shift to allow the use of a twelve-pulse rectifier 135 with low harmonics. In particular embodiments, the stator winding 112 can be configured for dual wye-delta outputs (e.g., a 12-phase 24-pulse system) to suit high-order rectifier systems with very low harmonic content. In such configurations, external power filters are minimized.

The switch 132, typically a contactor, operates to disconnect the system 100 from the utility source 130 when the utility source 130 becomes unavailable and to connect the system 100 to the utility source 130 when the utility source 130 is available. The switch 132 may also take the form of a solid-state transfer switch utilizing thyristor, IGBT, or high power MOSFET switches. If the utility source 130 is initially available, becomes unavailable, and then becomes available again, the switch 132 operates to switch the utility source 130 back into the system 100, and the prime mover 105 can stop and thereby stop rotation in the WRIG 110.

Before a transition from utility mode to island mode, the WRIG 110 can be stationary. The transition from utility mode to island mode may become necessary when power from the utility source 130 is unavailable or is not reliable, including when there is a loss of a phase input or low voltage. At the start of island mode, to initiate movement of the rotor 111 after being disconnected from the utility source 130, the WRIG 110 is first excited by a DC-to-AC rotor exciter 115, which is a DC-to-AC inverter connected to the rotor winding 113 and configured to supply power to the rotor circuit of the WRIG 110. The DC-to-AC rotor exciter 115 receives suitable power, such as from a capacitor source 120 or an engine battery 125, and uses the received power to start the WRIG 110. The capacitor source 120 represents any suitable source of capacitor power and may include the energy storage bank 140 or may represent another energy source, such as an external capacitive energy storage bank. The engine battery 125 represents any suitable battery source. In some embodiments, the engine battery 125 is a 28 VDC battery and may include a battery of the prime mover 105.

In island mode, once the WRIG 110 is operating at a specified speed (such as a 50% speed or greater), the WRIG 110 builds up excitation to the preferred voltage level to charge the energy storage bank 140. Steady-state operation of the WRIG 110 uses DC power received from the energy storage bank 140 as a source of excitation energy, such as at 2% of main output rating. Thus, the power amplification would be 50:1 in this example, although other ratios are also possible.

Power that is output from the WRIG 110 in either island mode or utility mode is input to the rectifier 135. The rectifier 135 is a controlled AC-DC rectifier that receives the AC power output from the WRIG 110 and rectifies the power to DC power, which allows the DC power to be stored in the energy storage bank 140. The rectifier 135 includes any suitable structure for AC-DC power rectification.

The energy storage bank 140 operates as the central energy storage element of the system 100 when in utility mode and the WRIG 110 is stationary. In island mode, when the WRIG 110 is operating from the prime mover 105, there is combined energy storage of the energy storage bank 140 and engine flywheel inertia that is part of the WRIG 110. Thus, in island mode, the energy storage bank 140 may operate as the primary energy storage, while the inertial energy of the engine flywheel may represent the secondary energy storage.

During a transition from utility mode to island mode, the energy storage bank 140 facilitates the rapid switching between the utility source 130 and the prime mover 105. When the WRIG 110 has not yet started spinning at the start of island mode and is not yet generating power, the energy storage bank 140 can temporarily provide power to the load(s) 160 while the WRIG 110 spins up. Likewise, the energy storage bank 140 maintains bus voltage and provides power to the load 160 during a transition from island mode to utility mode. A charging circuit 142 connects the energy storage bank 140 to the DC bus 145, and controls the charging and discharging of the energy storage bank 140.

The inverter 150 is a frequency converter that receives power on the DC bus (from the WRIG 110, the energy storage bank 140, or both) and converts the DC power to controlled AC power for output to the load(s) 160. The inverter 150 can convert the power to any suitable frequency, such as 60 Hz, 400 Hz, or the like. This allows different loads 160 at different voltages and frequencies to be connected to the system 100. Frequency conversion by the inverter 150 further obviates the need for a separate, heavy power transformer to yield the correct output voltage. A three-pole double-throw (3PDT) switch 155 is disposed in front of the load(s) 160 and allows switching between power from the inverter 150 and an alternate power path directly from the WRIG 110. The switch 155 may be an electromechanical device or a solid-state transfer switch.

The transition between using the utility source 130 as a source (utility mode) and using the prime mover 105 as a source (island mode) is seamless and transparent to the load(s) 160, due to the energy available from the energy storage bank 140. It is noted that use of the switch 132 for switching the utility source 130 can, in some cases, create voltage spikes at the time of a switch. Such spikes may be harmful to downstream components, such as the load(s) 160. To alleviate this issue, the system 100 uses the rectifier 135 and the inverter 150 to electrically isolate the load(s) 160 from the prime mover 105 or the utility source 130. Thus, switching the system 100 from utility mode to island mode (or vice versa) is seamless and fast, since all energy from the WRIG 110 passes through the rectifier 135, the DC bus 145, and the inverter 150 under typical operating conditions.

Use of the WRIG 110 as a step-up or step-down transformer (when the prime mover 105 is off) obviates the need for a separate and heavy input transformer. Such transformers typically add substantial weight and size to a power system and generate a substantial amount of heat in the power system. Thus, compared to conventional power systems, the system 100 is capable of improved kW/kg overall power density. In some embodiments, without a transformer, the entire system 100 can be 10,000 kg or less and can be portable enough (both in size and weight) to be placed on a trailer, pallet, or other platform, that can fit in an aircraft or land or sea cargo vehicle. Of course, these values are merely examples, and other weights are within the scope of this disclosure.

Although FIG. 1 illustrates one example of a mobile hybrid electric power system 100, various changes may be made to FIG. 1. For example, the components shown in FIG.

1 may be removed or arranged in other configurations, and additional components may be added. As a particular example, it is practical to insert a step-up gearbox between the prime mover 105 and the WRIG 110 so that the generator operates at a speed substantially higher than the prime mover 105. In general, power systems come in a wide variety of configurations, and FIG. 1 does not limit this disclosure to any particular configuration of power system. Also, while FIG. 1 illustrates one example operational environment in which a mobile hybrid electric power system can be used, this functionality may be used in any other suitable system.

Figure 2:
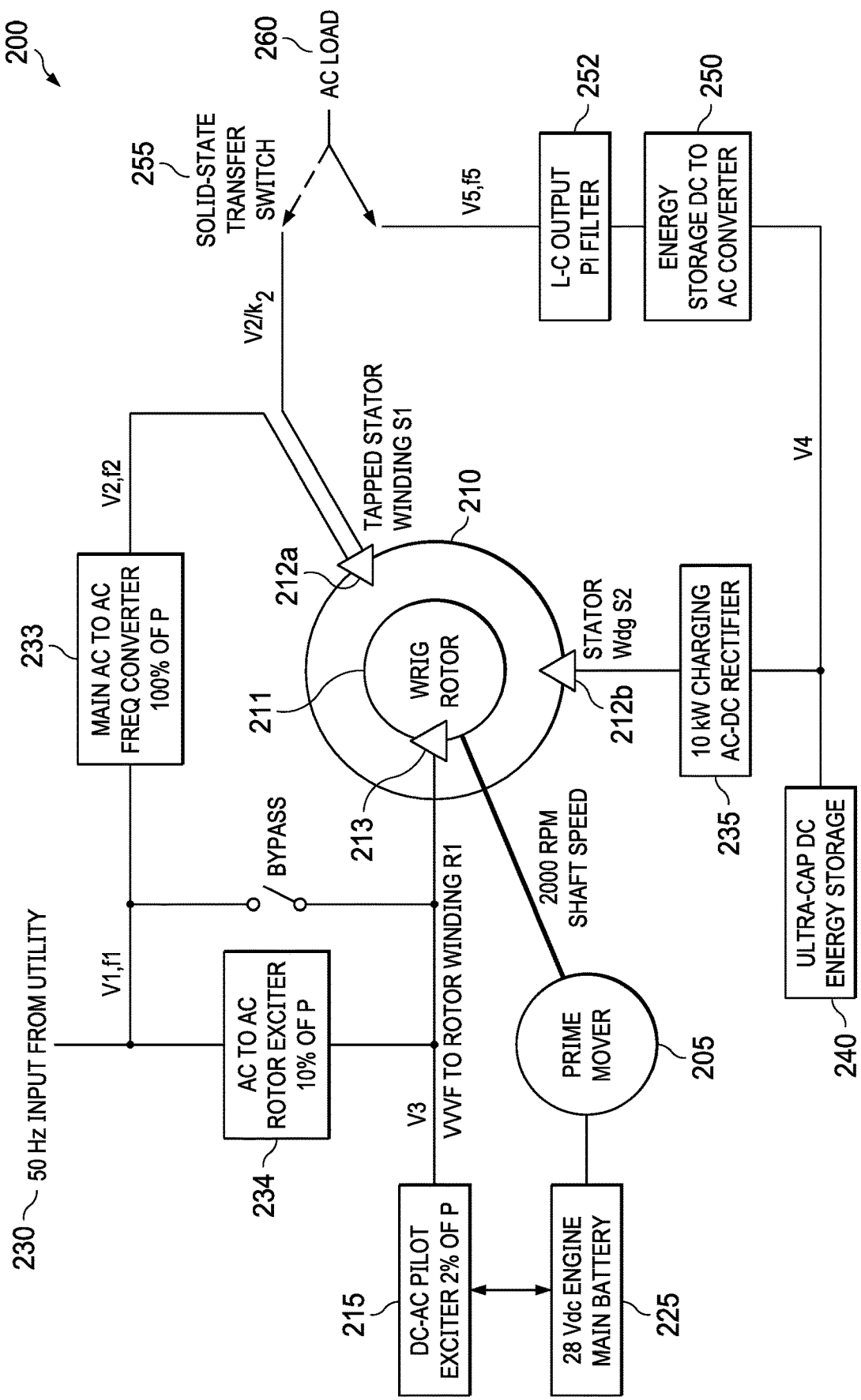
FIG. 2 illustrates another example mobile hybrid electric power system according to this disclosure.

FIG. 2 illustrates another example mobile hybrid electric power system 200 according to this disclosure. As shown in FIG. 2, the system 200 includes multiple components that may be the same as or similar to corresponding components of the system 100 of FIG. 1. For example, the system includes a WRIG 210 that is coupled to a prime mover 205 and electrically connected to a utility source 230, and the WRIG 210 is configured to provide power to at least one load 260. These components may be the same as or similar to the WRIG 110, the prime mover 105, the utility source 130, and the load(s) 160 of FIG. 1.

Like the WRIG 110, the WRIG 210 is configured to operate in utility mode or island mode. In utility mode, the WRIG 210 receives power from the utility source 230 via an AC-to-AC frequency converter 233, which converts the voltage (V1) and frequency (f1) from the utility source 230 to an input voltage (V2) and frequency (f2) for the WRIG 210. When power from the utility source 230 becomes unavailable or unreliable, the WRIG 210 switches to island mode.

At the start of island mode, to initiate movement of a rotor 211 after being disconnected from the utility source 230, the WRIG 210 is first excited by a DC-to-AC rotor exciter 215 or an AC-to-AC rotor exciter 234. In some embodiments, the DC-to-AC rotor exciter 215 may receive power from an engine battery 225, while the AC-to-AC rotor exciter 234 may receive power from the utility source 230. The DC-to-AC exciter 215 and the engine battery 225 may be the same as or similar to the DC-to-AC rotor exciter 115 and the engine battery 125 of FIG. 1.

The WRIG 210 includes the rotor 211 and a corresponding polyphase rotor winding 213, which may be the same as or similar to the rotor 111 and rotor winding 113 of FIG. 1. The WRIG 210 also includes multiple stator windings 212a-212b, which are advantageous to enhance system operational flexibility. In utility mode, the stator winding 212a receives the (V2) power originating at the utility source 230 and transforms the power to a different voltage (V2/k$_2$), where k$_2$ is a transformation coefficient determined by the configuration of the stator winding 212a. Some example configurations of stator windings are described in greater detail below in conjunction with FIGS. 3A, 4A, and 4B. The stator winding 212b provides power to be stored in an ultra-capacitor storage 240. The stator winding 212b can be a delta configuration, whereas the stator winding 212a is a wye configuration; additionally the output of the stator winding 212b can be a higher phase number (e.g., 6, 9 or 12) than the utility source, which reduces harmonic content on the rectified output. The ultra-capacitor storage 240 is charged by the WRIG 210 during island mode when the prime mover 205 moves. During charging, power from the stator winding 212b is output to the ultra-capacitor storage 240 via a AC-DC rectifier 235. The AC-DC rectifier 235 also provides for a discharge of the capacitor bank, which is necessary for a transport mode or if the voltage rises beyond safe levels.

The ultra-capacitor storage 240 may be the same as or similar to the energy storage bank 140 of FIG. 1. Power from the ultra-capacitor storage 240 can be supplied to the load(s) 260 when the utility source 230 is unavailable. The DC power from the ultra-capacitor storage 240 is converted to AC by a DC-to-AC converter 250 and filtered by a Pi-type L-C filter 252 before being supplied to the load(s) 260. The DC-to-AC converter 250 also generates the frequency of the power to be suitable for the load(s) 260, similar to the inverter 150 of FIG. 1. In some embodiments, the DC-to-AC converter 250 is bidirectional in power and current flow and is configured to allow load energy to charge the ultra-capacitor storage 240.

Unlike the system 100 of FIG. 1, the ultra-capacitor storage 240 is not used as an energy source when the system 200 is running off the utility source 230. When the utility source 230 becomes unavailable, the system 200 switches to power received from the ultra-capacitor storage 240. A solid-state transfer switch 255 is configured to switch between power from the utility source 230 and power from the ultra-capacitor storage 240.

Although FIG. 2 illustrates another example of a mobile hybrid electric power system 200, various changes may be made to FIG. 2. For example, the stator winding 212a may also be an input to the AC-DC rectifier 235, in addition to the stator winding 212b input forming a higher pulse system with lower harmonic levels. The components shown in FIG. 2 may be removed or arranged in other configurations, and additional components may be added. In general, power systems come in a wide variety of configurations, and FIG. 2 does not limit this disclosure to any particular configuration of power system. Also, while FIG. 2 illustrates another example operational environment in which a mobile hybrid electric power system can be used, this functionality may be used in any other suitable system.

Figure 3A:
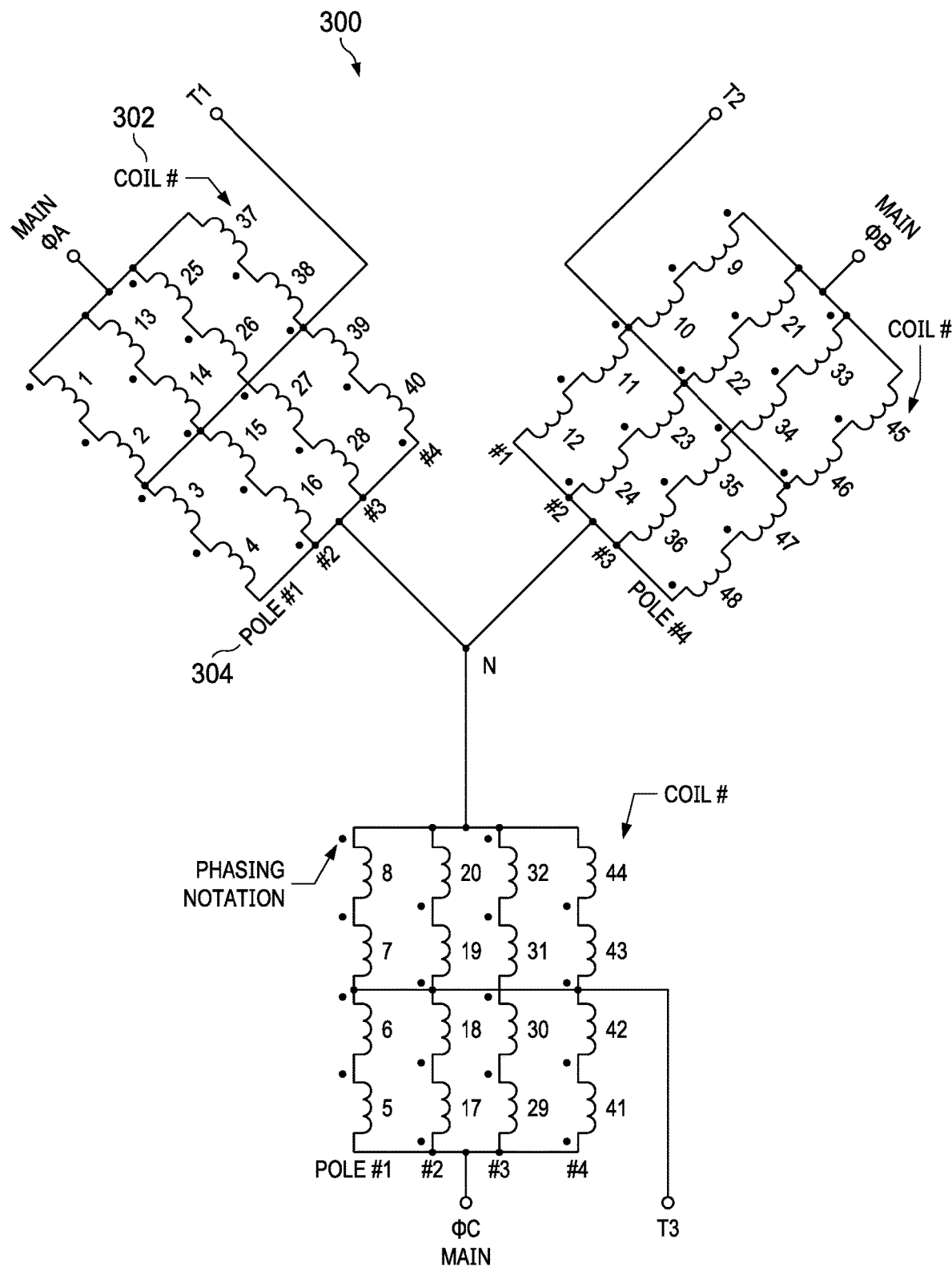
FIGS. 3A and 3B illustrate schematic layouts of example stator and rotor windings for use in a mobile hybrid electric power system according to this disclosure.
Figure 3B:
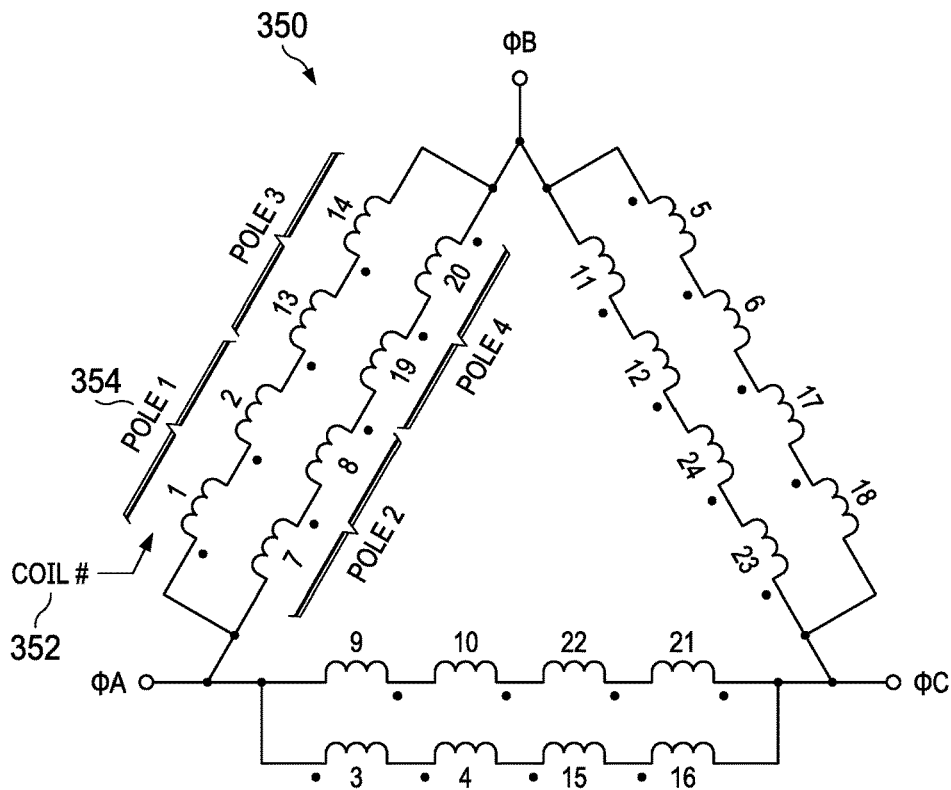

FIGS. 3A and 3B illustrate schematic layouts of example stator and rotor windings 300 and 350 for use in a mobile hybrid electric power system according to this disclosure. In particular, FIG. 3A shows a stator winding 300, and FIG. 3B shows a rotor winding 350. The rotor winding 350 is fed by a slip-ring and brush subsystem typical of standard wound rotor AC machines. Together, the stator winding 300 and the rotor winding 350 form a power generator that is applicable to any shaft speed. For ease of explanation, the stator winding 300 and the rotor winding 350 are described as forming part of the WRIG 110 of FIG. 1 or the WRIG 210 of FIG. 2. However, the stator winding 300 and the rotor winding 350 shown in FIGS. 3A and 3B may be used in any other suitable electrical or electronic component.

As shown in FIG. 3A, the stator winding 300 has an "auto-transformer" connection and includes forty-eight coils or slots 302 and four poles 304, which are numbered as shown in FIG. 3A. In some embodiments, the stator winding 300 is a 50% voltage-tapped polyphase stator winding with three taps T1, T2, and T3. In the embodiment shown in FIG. 3A, the slots 302 and poles 304 are arranged in a three-phase wye configuration. In some embodiments, the stator winding 300 can represent the stator winding 112 of FIG. 1.

As shown in FIG. 3B, the rotor winding 350 includes twenty-four slots 352 and four poles 354, which are numbered as shown in FIG. 3B. The slots 352 and poles 354 are arranged in a three-phase delta configuration. In some embodiments, the rotor winding 350 can represent the rotor winding 113 of FIG. 1.

Although FIGS. 3A and 3B illustrate schematic layouts of examples of the stator winding 300 and the rotor winding 350 for use in a mobile hybrid electric power system, various changes may be made to FIGS. 3A and 3B. For example, the stator winding 300 and the rotor winding 350 may each include any suitable number of slots and any suitable number of poles, which can be arranged in suitable configurations that have multiples of four poles.

Figure 4C:
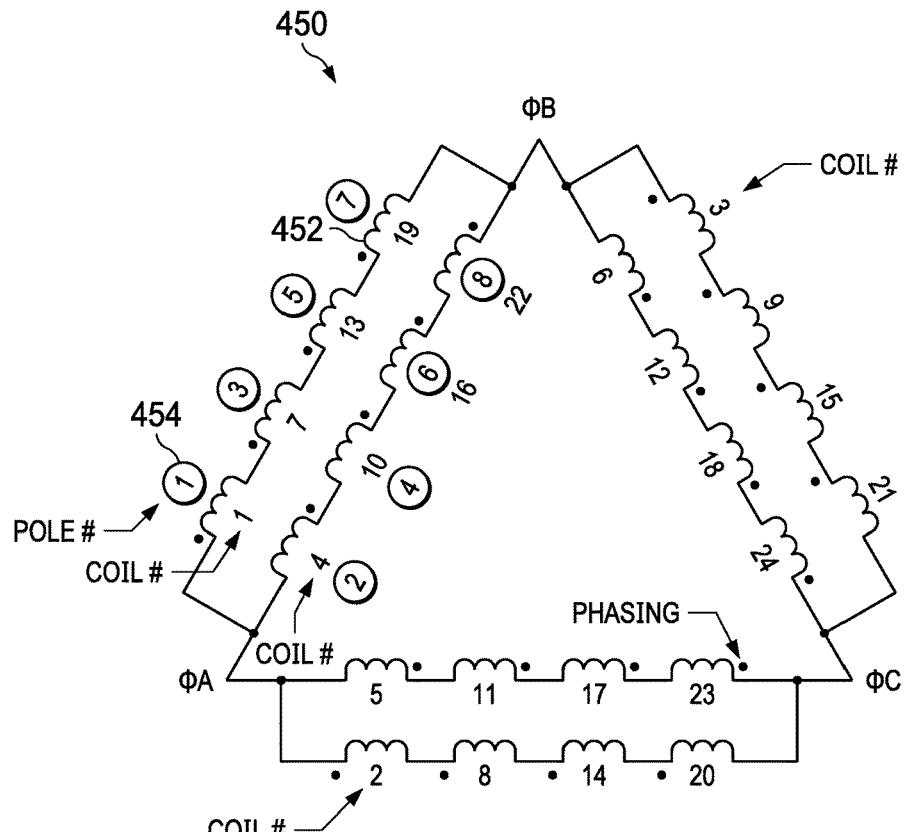
FIGS. 4A through 4C illustrate schematic layouts of other example stator and rotor windings for use in a mobile hybrid electric power system according to this disclosure.
Figure 4A:
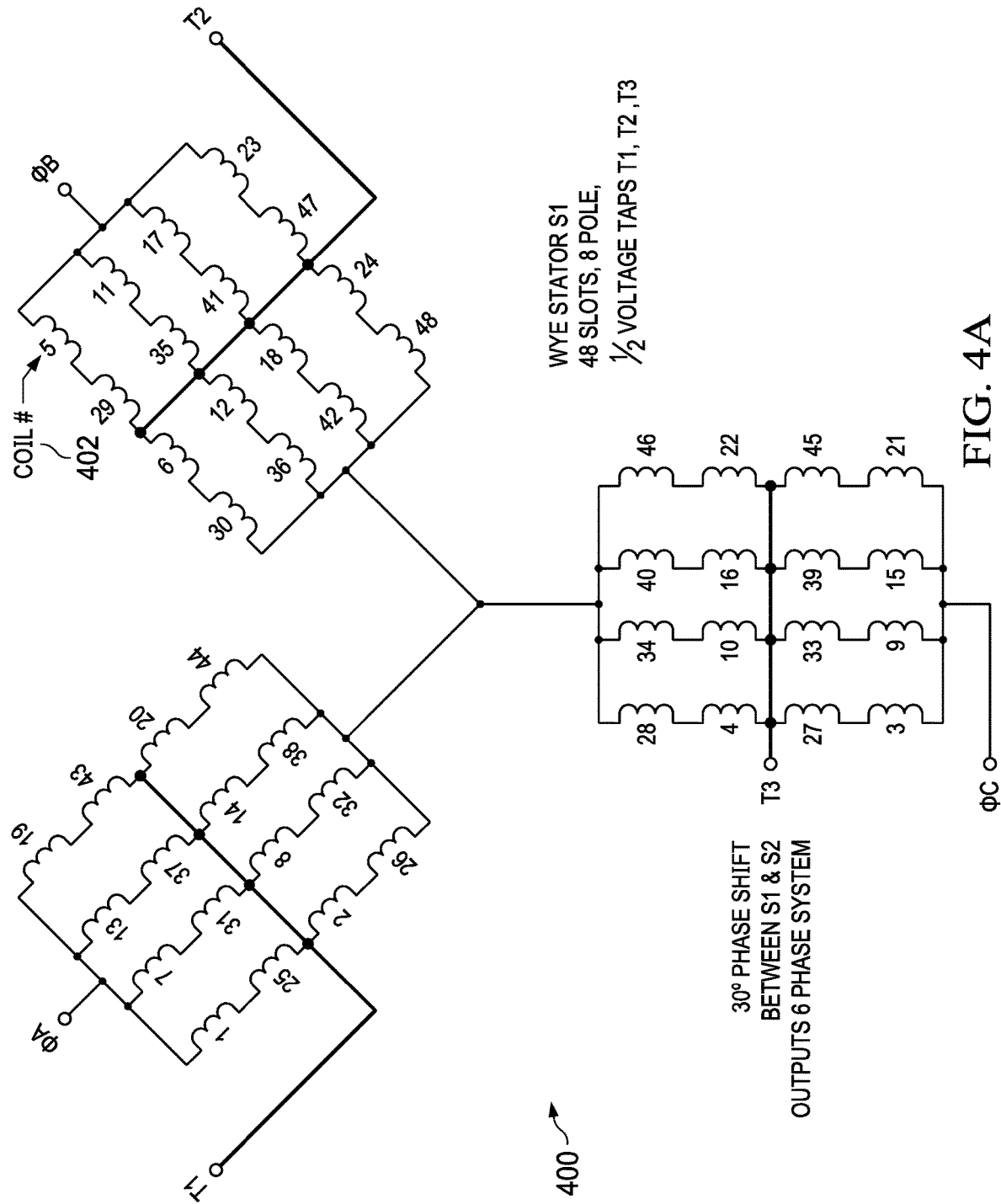
Figure 4B:
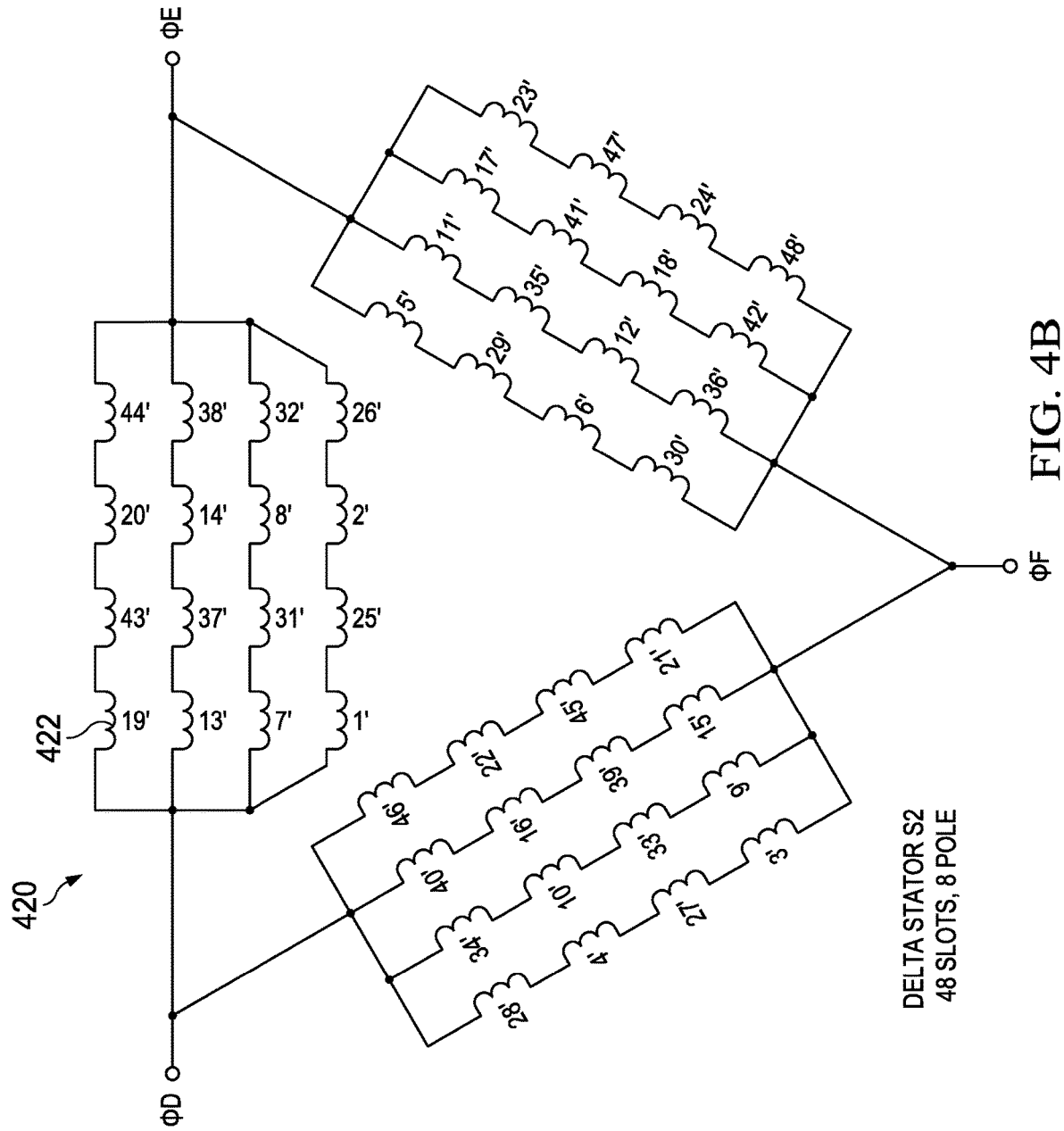

FIGS. 4A through 4C illustrate schematic layouts of other example stator and rotor windings 400, 420, 450 for use in a mobile hybrid electric power system according to this disclosure. In particular, FIGS. 4A and 4B show two electrically independent stator windings 400 and 420 that can be used together, and FIG. 4C shows a rotor winding 450 that can be used with the stator windings 400 and 420. Together, the stator windings 400 and 420 and the rotor winding 450 form a power generator that is applicable to any shaft speed. For ease of explanation, the stator windings 400 and 420 and the rotor winding 450 are described as forming part of the WRIG 210 of FIG. 2. However, the stator windings 400 and 420 and the rotor winding 450 shown in FIGS. 4A through 4C may be used in any other suitable electrical or electronic component.

As shown in FIG. 4A, the stator winding 400 includes forty-eight double-layer coils arranged in forty-eight slots 402, which are numbered as shown in FIG. 4A, and eight poles. In some embodiments, the stator winding 400 is a 50% voltage-tapped polyphase stator winding with three taps T1, T2, and T3. In the embodiment shown in FIG. 4A, the slots 402 are arranged in a three-phase wye configuration. In some embodiments, the stator winding 400 can represent the stator winding 212a of FIG. 2.

As shown in FIG. 4B, the stator winding 420 includes forty-eight coils arranged in forty-eight slots 422, which are numbered as shown in FIG. 4B, and eight poles. In the embodiment shown in FIG. 4B, the slots 422 are arranged in a three-phase delta configuration. In some embodiments, the stator winding 420 can represent the stator winding 212b of FIG. 2. The stator winding 420 here shadows the main stator winding 400 in consequent slots. In some embodiments, there is a 30° phase shift between the outputs of the stator winding 400 and the stator winding 420.

As shown in FIG. 4C, the rotor winding 450 includes twenty-four slots 452 and eight poles 454, which are numbered as shown in FIG. 4C. The slots 452 and poles 454 are arranged in a three-phase, lap-wound delta, double-layer configuration. In some embodiments, the rotor winding 450 can represent the rotor winding 213 of FIG. 2. In operation, variable frequency can be applied to the rotor winding 450 to yield a wide range of output frequencies. The applied rotor current may be positive sequence or negative sequence.

Together, the stator windings 400 and 420 and the rotor winding 450 form a wye-delta, six-phase, eight-pole, 50% tapped power generator in ninety-six slots. Similar embodiments can include other numbers of tapped windings for higher pole numbers, such as 16-pole, 20-pole, 24-pole, 28-pole, and the like. The stator windings 400 and 420 have two slots/pole/phase and the rotor winding 450 has one slot/pole/phase.

Although FIGS. 4A through 4C illustrate schematic layouts of other examples of the stator windings 400 and 420 and the rotor winding 450 for use in a mobile hybrid electric power system, various changes may be made to FIGS. 4A through 4C. For example, the stator windings 400 and 420 and the rotor winding 450 may each include any suitable number of slots and any suitable number of poles, which can be arranged in many suitable configurations.

Figure 5:
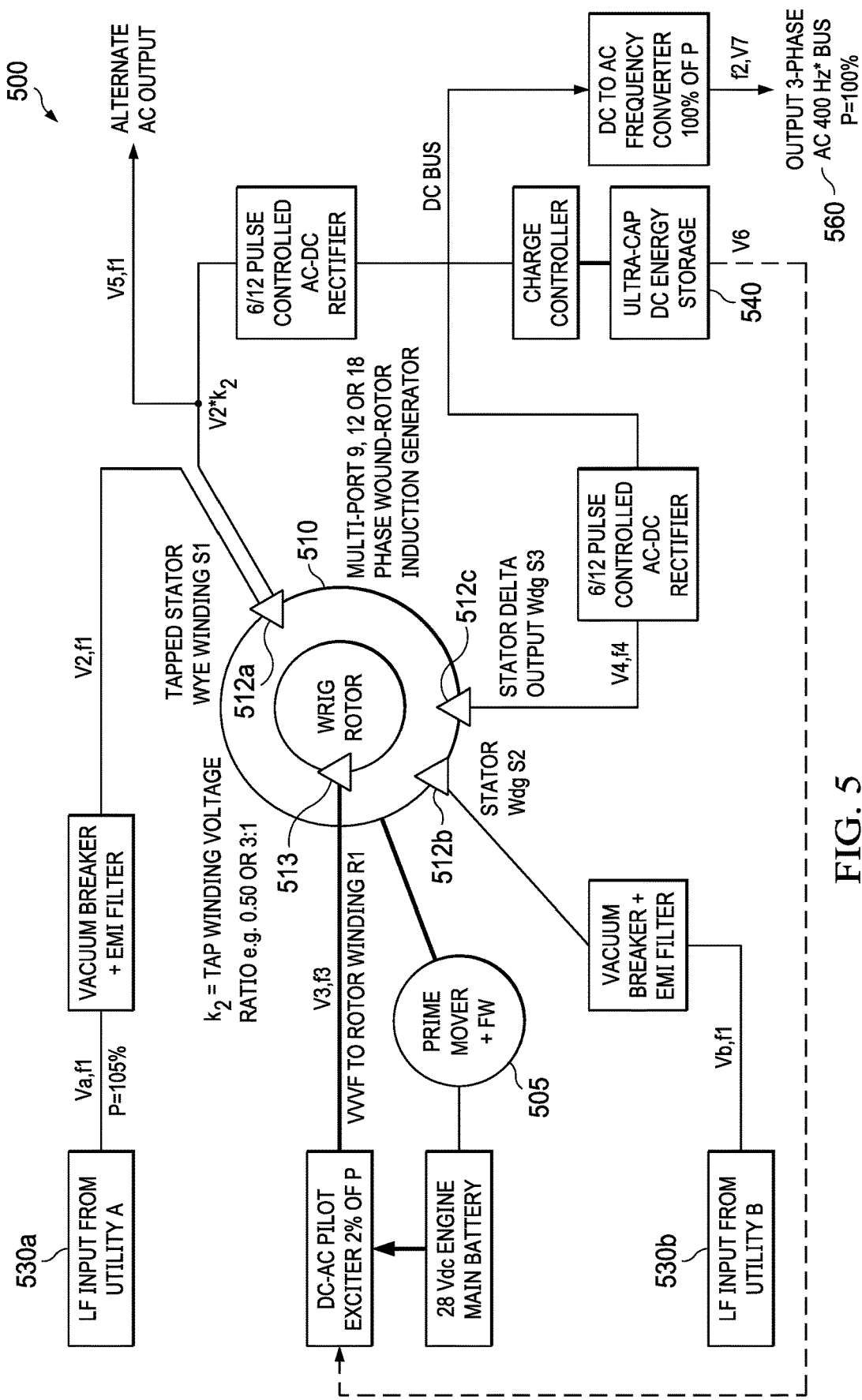
FIG. 5 illustrates another example mobile hybrid electric power system according to this disclosure.

FIG. 5 illustrates another example mobile hybrid electric power system 500 according to this disclosure. As shown in FIG. 5, the system 500 includes multiple components that may be the same as or similar to corresponding components of the system 200 of FIG. 2. For example, the system 500 includes a WRIG 510 that is coupled to a prime mover 505, and the WRIG 510 is configured to provide power to at least one load 560. These components may be the same as or similar to the WRIG 210, the prime mover 205, and the load(s) 260 of FIG. 2.

As shown in FIG. 5, the WRIG 510 can receive power from two independent utility sources 530a and 530b at different voltage levels Va & Vb respectively. The WRIG 510 has two independent stator input windings 512a and 512b, which are matched in frequency, winding pitch, and poles, but have different airgap flux levels to accommodate different input voltages and power Pa and Pb derived from two different sources. The stator winding 512a is tapped to allow for a direct AC output at a voltage different from the source voltage Va and also allows for charging the DC capacitor storage bank 540 at an optimum voltage level without use of conventional power transformers.

The power ratings of the two sources 530a and 530b or input windings need not be matched; however the design of the WRIG 510 allows the inputs from the two sources 530a and 530b to be combined into a common output power as Pt=Pa+Pb, which then undergoes voltage transformation to a third voltage level V4 for an output port on a third stator winding 512c used to charge the capacitive energy storage bank 540 after full wave rectification. The sources 530a and 530b can be utilized simultaneously or one at a time.

The system 500 has two paths to charge the DC energy storage capacitor bank 540—one from the tapped stator winding 512a and one from the stator winding 512c. The AC output from the stator winding 512a is at utility source frequency, which is usually a lower frequency (50 or 60 Hz). When the utility source is disconnected or inactive, the AC output from the stator winding 512c can be at significantly higher frequency f4 than the utility source, such as 400 Hz, which makes for a more efficient and compact rectifier subsystem. The higher frequency output at the stator winding 512c is due to the excitation of the rotor circuit 513 at a frequency f3 which when numerically combined with the actual rotor speed produces a higher frequency f4 in the stator winding 512c. In one embodiment, the rotor frequency f3 can be progressively increased as the rotor drops in speed due to extracting energy from the rotor inertia, and in so doing, the output frequency f4 remains nearly constant over a wide speed range.

The system 500 uses a polyphase rotor winding 513 for overall machine excitation at excitation frequency f3. The system 500 can be extended to have greater than two independent input or utility sources, and the WRIG 510 can be designed to have greater than three stator windings.

Although FIG. 5 illustrates another example of a mobile hybrid electric power system 500, various changes may be made to FIG. 5. For example, the components shown in FIG. 5 may be removed or arranged in other configurations, and additional components may be added. In general, power systems come in a wide variety of configurations, and FIG. 5 does not limit this disclosure to any particular configuration of power system. Also, while FIG. 5 illustrates another example operational environment in which a mobile hybrid electric power system can be used, this functionality may be used in any other suitable system.

Table 1 shows a specific 600 kW example of a wound-rotor 2-pole multi-port induction machine design for the system 500, whereby there are two independent power sources at a low frequency and the machine polyphase output is at a higher frequency. This machine includes a tapped stator winding so output can be derived directly from the source at source frequency but a voltage different from source without use of discrete transformers.

TABLE 1

Parameters of Hybrid Generating System Wound-Rotor Induction Machine with Dual Source Inputs (Two sources are at same frequency 60 Hz, output frequency is 400 Hz for efficient rectification)

| | |
|---|---|
| Machine Type | Wound rotor with separately excited 3-phase rotor |
| Output Power Rating | 600 kW, 720 kVA |
| Rotational Speed | Base = 3600 rpm, Operating range in discharge mode: 1800-3600 rpm |
| Source Voltage A | 480 Volts, 60 Hz, 3-phase as input to stator winding S1 |
| Source Voltage B | 4160 Volts, 60 Hz, 3-phase as input to stator winding S2 |
| Tapped Voltage on Stator S1 | 240 Volts, 60 Hz, 3 phase for use in 60 Hz output loads |
| Stator Output Winding | 445 Volts L-L, 400 Hz, 6-phase denoted as winding S3 |
| Winding S3 as rectified | 600 VDC for input voltage to energy storage bank |
| Total No. Stator Slots | 108 as 24 slots in S1, 48 slots in S2 and 36 slots in S3 |
| Slots/pole/phase/winding | q = 4 for S1, q = 8 for S2 and q = 3 for S3 |
| Winding Type | Double- layer lap-wound diamond coils |
| Power Rating for S1 | 200 kW, 240 kVA, 289 Amps/phase |
| Power Rating for S2 | 400 kW, 480 kVA, 66.6 Amps/phase |
| Power Rating for S3 | 600 kW, 720 kVA, 467 Amps/phase in 6-phase system |
| Winding S1- Delta | 60 Volts/coil with all coils in each phase in series |
| Winding S2-Wye | 150 Volts/coil with all coils in each phase in series |
| Winding S3-Delta | 74.2 Volts/coil with all coils in each phase in series |
| Rotor | 3-Phase wound in Delta with 3 slip rings |
| Number of Rotor Slots | 36 |
| Rotor Slip Power Rating | 12 kW at base frequency 1.2 Hz in charging mode from 60 Hz input |
| Rotor Frequency | 340-370 Hz to yield 400 Hz output on S3 when in discharge mode |
| Rotor Voltage/Current | 480 Volts L-L at 14.4 Amps/phase |
| Airgap Flux Density | 75 kG |
| Stator Core Flux Density | 97 kG |
| Rotor Diameter | 19.0 inches |
| Radial Electromagnetic Airgap | 0.060 inch |
| Rotor Length | 27.0 inches |

Figure 6:
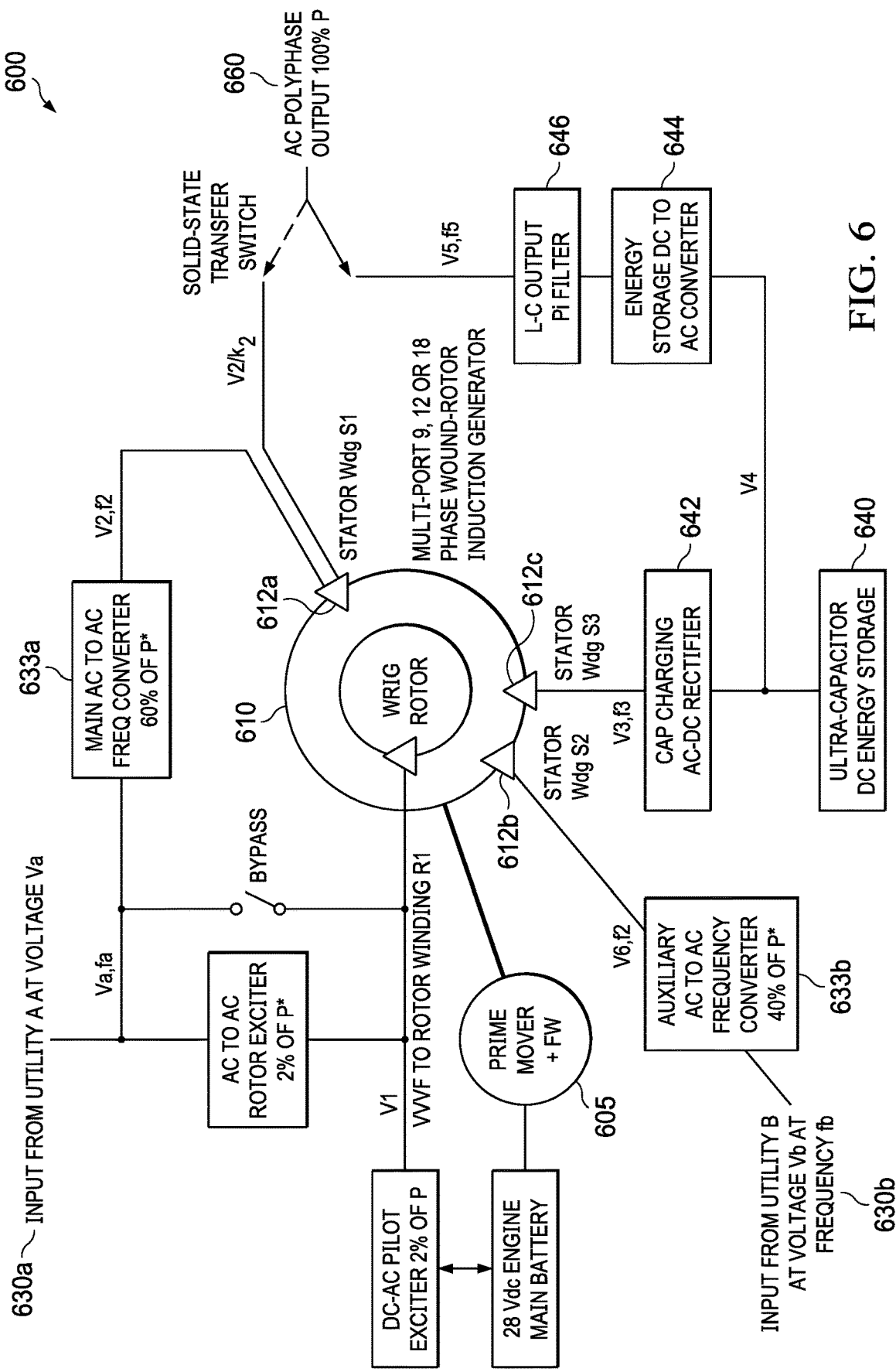
FIG. 6 illustrates another example mobile hybrid electric power system according to this disclosure.

FIG. 6 illustrates another example mobile hybrid electric power system 600 according to this disclosure. As shown in FIG. 6, the system 600 includes multiple components that may be the same as or similar to corresponding components of the system 200 of FIG. 2. For example, the system 600 includes a WRIG 610 that is coupled to a prime mover 605, and the WRIG 610 is configured to provide power to at least one load 660. These components may be the same as or similar to the WRIG 210, the prime mover 205, and the load(s) 260 of FIG. 2.

As shown in FIG. 6, the WRIG 610 can receive power from two independent utility sources 630a and 630b at different voltage levels Va & Vb respectively and at different frequencies fa and fb. The system 600 includes two AC to AC frequency converters 633a and 633b (one for each source 630a and 630b), which convert both input frequencies to a common frequency f2 for input to the WRIG 610. The WRIG 610 has two independent stator input windings 612a and 612b, which are matched in frequency, winding pitch, and poles, but may have different airgap flux levels to accommodate different input voltages and power Pa and Pb derived from two different sources. The stator winding 612a is tapped to allow for a direct AC output at a voltage different from the source voltage Va when in the "utility" mode.

The output of the WRIG 610 from a third stator winding 612c in the "island" mode is the only means for charging the DC capacitor storage bank 640 at an optimum voltage level without use of conventional power transformers.

The power ratings of the two sources 630a and 630b or input windings need not be matched; however the design of the WRIG 610 allows the inputs from the two sources 630a and 630b to be combined into a common output power as Pt=Pa+Pb, which then undergoes voltage transformation to a third voltage level V3 as an output port on the third stator winding 612c subsequently used to charge the capacitive energy storage bank 640 after full wave rectification. The stator may have a total of 9 phases or alternately 12 phases total for a higher phase output for the stator winding 612c to allow more efficient rectification.

The system 600 in "island" mode allows the WRIG 610 to operate at high rotational speeds exceeding 3600 rpm by use of a step-up gearbox, and when combined with excitation of the rotor at a high frequency produces a high frequency output (240-2000 Hz) f3 at the stator winding 612c, which is advantageous for compact rectification. For example if the shaft speed is 7200 rpm on a 4-pole WRIG, and rotor frequency is 360 Hz, the output frequency f3 can be 600 Hz.

The system 600 can be extended to have greater than two independent input or utility sources, greater than two frequency converters, and the WRIG 610 can be designed to have greater than three stator windings.

The system 600 utilizes stored kinetic energy of the electrical machine-flywheel inertia to provide a seamless transfer of power from the utility source to the load when the energy storage capacitor is discharged or not of sufficient charge to fully support the load. The system 600 also provides a continuous stream of power from the two sources 630a and 630b through the electrical machine to the rectifiers, energy storage bank, and DC-AC converter and hence to the load, independent of machine speed and irrespective of stored energy in the flywheel.

The electrical machine provides a voltage transformation from its two input sources after frequency converters 633a and 633b and can be at different or same input voltages V2 and V6 to the WRIG 610, hence to its common output terminal of voltage V3. Voltage transformation occurs since the WRIG 610 may have a different number of turns per phase, different distribution factors and different chording factors for its three stator windings 612a-612c. The system 600 does not permit the utility source to directly charge the energy storage bank 640; rather the energy storage bank 640 is exclusively charged by the stator winding 612c acting as the singular supply through an AC-DC rectifier system 642. The stator winding 612c can be single phase or polyphase. The energy storage bank output has one output DC to AC converter 644 and one output power filter 646. The DC to AC converter may have either single phase or polyphase output. The energy storage bank 640 may be an ultra-capacitor, electrochemical storage battery, or auxiliary kinetic energy device.

Although FIG. 6 illustrates another example of a mobile hybrid electric power system 600, various changes may be made to FIG. 6. For example, the components shown in FIG. 6 may be removed or arranged in other configurations, and additional components may be added. In general, power systems come in a wide variety of configurations, and FIG. 6 does not limit this disclosure to any particular configuration of power system. Also, while FIG. 6 illustrates another example operational environment in which a mobile hybrid electric power system can be used, this functionality may be used in any other suitable system.

Figure 7:
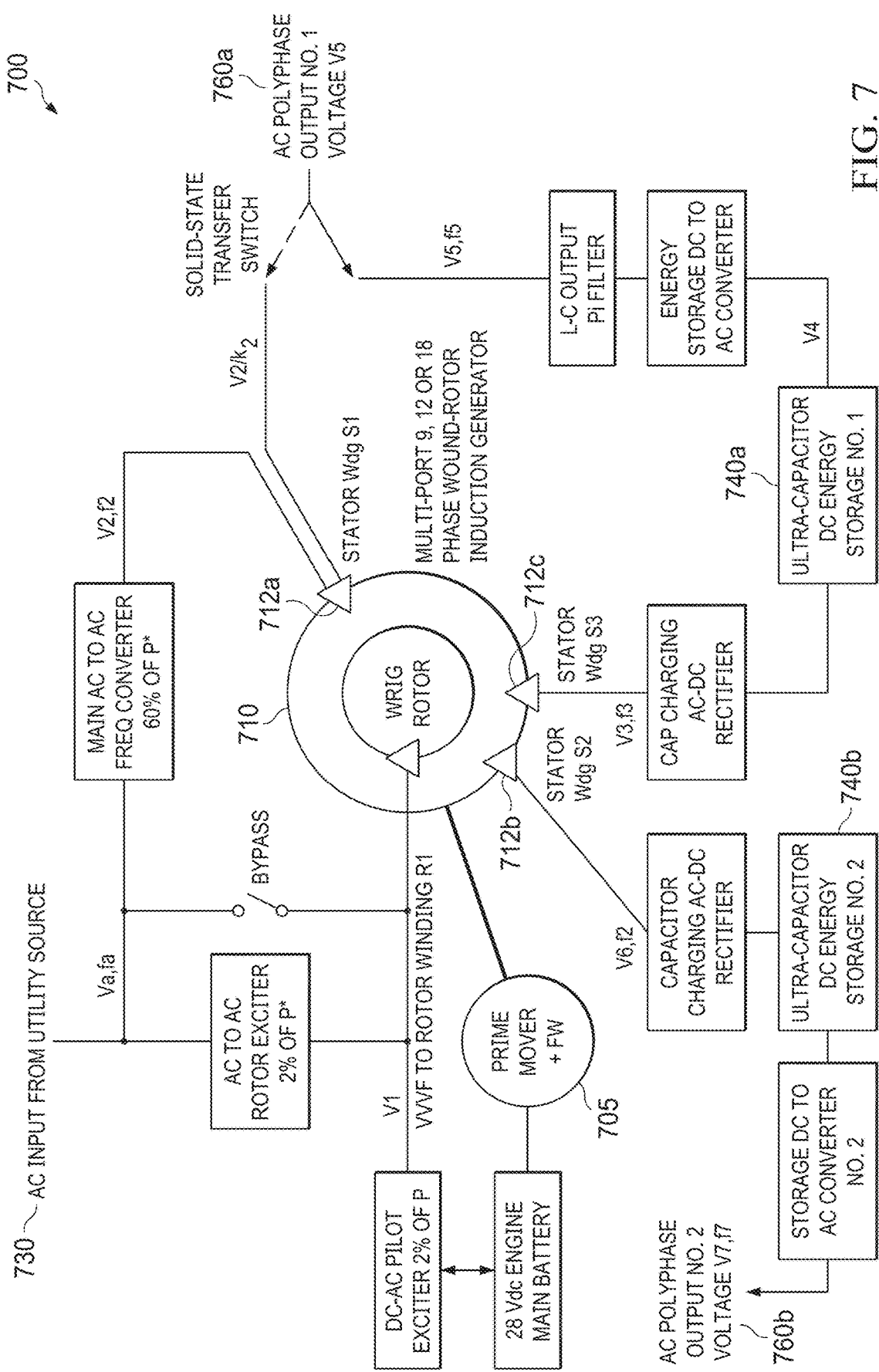
FIG. 7 illustrates another example mobile hybrid electric power system according to this disclosure.

FIG. 7 illustrates another example mobile hybrid electric power system 700 according to this disclosure. As shown in FIG. 7, the system 700 includes multiple components that may be the same as or similar to corresponding components of the system 200 of FIG. 2. For example, the system 700 includes a WRIG 710 that is coupled to a prime mover 705. These components may be the same as or similar to the WRIG 210 and the prime mover 205 of FIG. 2.

As shown in FIG. 7, the system 700 includes multiple independent energy storage banks 740a and 740b and dual AC outputs 760a and 760b. The outputs 760a and 760b can be at different frequencies f5 and f7 as well at different voltage levels V5 and V7. The WRIG 710 has one input stator winding 712a and two independent output stator windings 712b and 712c. In an embodiment, all stator windings are double-layer lap-wound 3-phase or higher phase number windings. Also, the stator windings can have separate and distinct voltage levels and are electrically isolated. In an embodiment, the combined apparent power rating of the stator windings 712b and 712c should be equal to or close to the apparent power rating of the stator winding 712a. The WRIG 710 has attached to the shaft directly or through a gearbox, a flywheel able to provide inertial storage energy to the WRIG 710 and hence to the two outputs 760a and 760b when the power from the utility source 730 to the stator winding 712a is not available. The system 700 also includes a tapped winding on the stator winding 712a so that without the WRIG 710 having inertial energy input or rotation, the load at the output 760a may access the utility power directly at the utility frequency fa albeit at a voltage different from the source voltage according to the tap percentage of the machine winding.

A further advantage of the dual output system 700 is that the two loads can be of totally different characteristics in terms of duty cycle, peak power, pulse repetition rate or time constants. For example the load at the output 760a may be a steady-state load such as a compressor, and the load at the output 760b can be a pulsed load such as a radar, which creates significant current and power transients. With the included energy storage banks and rectifiers, the electrical interaction between these two outputs 760a and 760b is minimized at the machine level by having the output windings S2 and S3 in separate stator slots or electrically-isolated winding segments, and thus there is little or no interference of one output to the other. The WRIG 710 is shown with three stator ports by example; the concept can be extended to any number of stator ports. The WRIG 710 is shown with one rotor AC port by example; the concept can be extended to a wound rotor electrical machine with multiple rotor polyphase ports.

Although FIG. 7 illustrates another example of a mobile hybrid electric power system 700, various changes may be made to FIG. 7. For example, the components shown in FIG. 7 may be removed or arranged in other configurations, and additional components may be added. In general, power systems come in a wide variety of configurations, and FIG. 7 does not limit this disclosure to any particular configuration of power system. Also, while FIG. 7 illustrates another example operational environment in which a mobile hybrid electric power system can be used, this functionality may be used in any other suitable system.

As described above, the disclosed embodiments provide mobile hybrid electric power systems that can seamlessly switch between grid and generator prime power sources. This is advantageous for many applications that require or prefer a system that includes both, such as ground-based mobile radar systems, missile defense systems, and marine-based platforms. The disclosed power systems are beneficial, as power capabilities increase for sensors and support equipment, while demands to reduce overall system weight and size also grow. The disclosed power systems can also advantageously supply various loads with power at variable power frequencies and voltage levels from a universal platform while maintaining mobility and portability.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
a prime mover configured to rotate a shaft; and
a wound rotor induction generator (WRIG) comprising:
a rotor coupled to the shaft of the prime mover and configured to rotate when the shaft rotates, the rotor comprising a rotor winding; and
a stator winding electrically connected to a utility source and a load;
wherein:
when the stator winding receives first power from the utility source, the WRIG is configured to transform at least one of a voltage and a frequency of the first power before outputting at least a portion of the first power to the load; and
when the stator winding does not receive the first power from the utility source, the WRIG is configured to generate second power due to kinetic energy of the rotor, and output at least a portion of the second power to the load.

2. The system of claim 1, further comprising:
an energy storage bank electrically connected to the stator winding, the energy storage bank configured to:
receive a second portion of the first power from the WRIG;
store the second portion of the first power while the WRIG is receiving the first power from the utility source;
receive a second portion of the second power from the WRIG; and
store the second portion of the second power while the WRIG is generating the second power.

3. The system of claim 2, further comprising:
a rectifier configured to rectify the first power and the second power from alternating current (AC) to direct current (DC) before the second portion of the first and second powers are received at the energy storage bank; and
an inverter configured to convert third power from the rectifier or the energy storage bank from DC to AC.

4. The system of claim 3, wherein the inverter is further configured to convert a frequency of the third power to any of multiple frequencies suitable for the load.

5. The system of claim 4, wherein the rectifier, the energy storage bank, and the inverter are configured to electrically isolate the load during a transition between the first power and the second power.

6. The system of claim 1, wherein the stator winding of the WRIG comprises multiple taps configured to transform the voltage of the first power to any of multiple voltage levels for the utility source which is either single-phase or polyphase.

7. The system of claim 1, further comprising:
a rotor excitation power supply electrically connected to the rotor winding and configured to excite the rotor when the WRIG transitions between receiving the first power from the utility source and generating the second power.

8. The system of claim 1, further comprising:
a switch electrically connected between the stator winding and the utility source and configured to switch out the utility source from the stator winding.

9. The system of claim 1, wherein the system is configured to transition from the utility source to the WRIG within one electrical cycle in a manner that is transparent to the load.

10. A system comprising:
a prime mover configured to rotate a shaft; and
a wound rotor induction generator (WRIG) comprising:
a rotor coupled to the shaft of the prime mover and configured to rotate when the shaft rotates, the rotor comprising a rotor winding;
a first stator winding electrically connected to a utility source and a load; and
a second stator winding electrically connected to an energy storage bank;
wherein:
when the first stator winding receives first power from the utility source, the WRIG is configured to transform at least one of a voltage and a frequency of the first power before outputting at least a portion of the first power to the load; and
when the first stator winding does not receive the first power from the utility source, the WRIG is configured to generate second power through the second stator winding due to kinetic energy of the rotor, and output at least a portion of the second power to the load.

11. The system of claim 10, wherein:
the WRIG is configured to output a second portion of the first power to the energy storage bank, and
the energy storage bank is configured to store the second portion of the first power for use when the WRIG transitions between receiving the first power from the utility source and generating the second power.

12. The system of claim 11, further comprising:
a rectifier configured to rectify the second portion of the first power from alternating current (AC) to direct current (DC) before the second portion is received at the energy storage bank; and
an inverter configured to convert third power from the rectifier or the energy storage bank from DC to a controllable frequency AC power.

13. The system of claim 12, wherein the inverter is bidirectional in power and current flow and is configured to allow load energy to charge the energy storage bank.

14. The system of claim 10, wherein the first stator winding comprises multiple taps configured to transform the voltage of the first power to any of multiple voltage levels.

15. The system of claim 10, further comprising a third stator winding, wherein:
the first stator winding is fed from the utility source at a first voltage level,
the third stator winding is fed from a second utility source at a second voltage level,
the second stator winding is configured to output a second portion of the first power at a third voltage level,
the second stator winding is configured to extract energy derived from the kinetic energy of the rotor and transfer the energy to the energy storage bank, and
the second portion of the first power is subsequently rectified and used to charge the energy storage bank.

16. The system of claim 10, further comprising:
a rotor excitation power supply electrically connected to the rotor winding and configured to excite the rotor at a controllable frequency and flux level when the WRIG transitions between receiving the first power from the utility source and generating the second power.

17. A device comprising:
a rotor configured to be coupled to a shaft of a prime mover and rotated when the shaft rotates, the rotor comprising a rotor winding; and
at least one stator winding configured to be electrically connected to a utility source and a load;
wherein:
when the at least one stator winding receives first power from the utility source, the device is configured to transform at least one of a voltage and a frequency of the first power before outputting at least a portion of the first power to the load; and
when the at least one stator winding does not receive the first power from the utility source, the device is configured to generate second power due to kinetic energy of the rotor and output at least a portion of the second power to the load.

18. The device of claim 17, wherein:
the at least one stator winding is further configured after rectification to be electrically connected to an energy storage bank; and
the device is configured to output a second portion of the first power to the energy storage bank that stores the second portion of the first power for use when the device transitions between receiving the first power from the utility source and generating the second power.

19. The device of claim 18, wherein the at least one stator winding comprises:
a first stator winding electrically connected to the load and configured to provide AC power; and
a second stator winding electrically connected after rectification to the energy storage bank, wherein the rectification is bidirectional such that that excess energy stored in the energy storage bank is returnable to the device through the second stator winding.

20. The device of claim 18, wherein:
the at least one stator winding comprises a first stator winding and a second stator winding, and the energy storage bank comprises a first energy storage bank;
the first stator winding is configured to charge the first energy storage bank;
the second stator winding is configured to charge a second energy storage bank; and
the first and second energy storage banks are configured for use on independent busses or combined to power common loads.

21. The device of claim 20, wherein:
the first stator winding is configured to charge the first energy storage bank at a first voltage level;
the second stator winding is configured to charge the second energy storage bank at a second voltage level; and
each of the first and second energy storage banks has an independent charging and discharging time or profile.

22. The device of claim 17, wherein the at least one stator winding comprises multiple taps configured to transform the voltage of the first power to any of multiple voltage levels.

23. The device of claim 17, wherein excitation of the rotor has a variable frequency excitation characteristic which allows frequency to increase in direct response to rotor speed decreasing as energy is extracted from the rotor to maintain a stator output frequency and voltage nearly constant during modes when rotor energy is being extracted.

* * * * *